United States Patent [19]
Matsumoto et al.

[11] Patent Number: 5,968,382
[45] Date of Patent: Oct. 19, 1999

[54] LASER CLEAVAGE CUTTING METHOD AND SYSTEM

[75] Inventors: Takashi Matsumoto; Shinichi Kazui; Hideaki Sasaki, all of Hadano; Tateoki Miyauchi, Yokohama; Tatsuji Sakamoto, Ushiku, all of Japan

[73] Assignee: Hitachi, Ltd., Tokyo, Japan

[21] Appl. No.: 08/679,661

[22] Filed: Jul. 12, 1996

[30] Foreign Application Priority Data

Jul. 14, 1995 [JP] Japan ..................................... 7-179046

[51] Int. Cl.⁶ .................................................. B23K 26/00
[52] U.S. Cl. ............................... 219/121.72; 219/121.67; 225/93.5
[58] Field of Search ......................... 219/121.67, 121.72, 219/121.83; 225/1, 93.5; 438/464

[56] References Cited

U.S. PATENT DOCUMENTS

| | | | |
|---|---|---|---|
| 4,121,087 | 10/1978 | Malmuth et al. | 219/121.63 |
| 4,663,513 | 5/1987 | Webber | 219/121.6 |
| 4,959,244 | 9/1990 | Penney et al. | 356/326 |
| 5,084,604 | 1/1992 | Dekker et al. | 219/121.72 |
| 5,283,416 | 2/1994 | Shirk | 219/121.83 |
| 5,334,816 | 8/1994 | Sugiyama | 219/121.83 |
| 5,373,135 | 12/1994 | Beyer et al. | 219/121.83 |
| 5,486,677 | 1/1996 | Maischner et al. | 219/121.83 |
| 5,543,365 | 8/1996 | Wills et al. | 438/464 |
| 5,609,284 | 3/1997 | Kondratenko | 219/121.72 |
| 5,674,415 | 10/1997 | Leong et al. | 219/121.63 |
| 5,826,772 | 10/1998 | Argilio et al. | 225/93.5 |

FOREIGN PATENT DOCUMENTS

| | | | |
|---|---|---|---|
| 59-206189 | 11/1984 | Japan | 219/121.72 |
| 3-161187 | 7/1991 | Japan . | |
| 4-37492 | 2/1992 | Japan . | |
| 4-118190 | 4/1992 | Japan . | |
| 4-167985 | 6/1992 | Japan . | |
| 5-309484 | 11/1993 | Japan . | |
| 6-39572 | 2/1994 | Japan . | |

*Primary Examiner*—Geoffrey S. Evans
*Attorney, Agent, or Firm*—Fay, Sharpe, Beall, Fagan, Minnich & McKee

[57] ABSTRACT

A cutting system for cutting a workpiece by laser emission relies upon local cooling of the workpiece at the point at which cutting starts and ends. Optionally, local cooling can also be provided at a cross point where two cutting lines intersect. Relying upon the difference in thermal stress between the laser beam incidence point and the surrounding cooled portion, an initial crack can be generated in a specified direction, whereby the initial crack is propagated to form the desired cutting line. In one embodiment, the cooling is provided by a low temperature solid such as a Peltier cooling plate and the temperature of the workpiece near a point of incidence of the laser beam is determined. The determination can be made by measuring the temperature of a plasma generated near the point of incidence, or by directly measuring the temperature of the portion of the workpiece near the point of incidence.

21 Claims, 7 Drawing Sheets

LASER CLEAVAGE CUTTING METHOD AND SYSTEM

BACKGROUND OF THE INVENTION

1. Field of the Invention

The present invention relates generally to the cutting of brittle materials to define, for example, a ceramic board used for an electrical device such as a printed circuit board, or a semiconductor wafer; to a cutting system suitable for carrying out the cutting method; and to a chip material obtained by laser cutting. The invention relates more particularly to such a cutting method and cutting system for initiating a clean cut in a board or chip material by controlling the initial parameters of the cut.

2. Description of the Related Art

Laser cutting is a preferred method of cutting a workpiece because it is substantially free of dust, dross cracking, and cutting allowance. Typically, laser cutting is performed by establishing an initial crack under thermal stress, and then by propagating the crack in the direction initiated by the crack itself. Laser cutting is considered quite suitable for cutting brittle materials such as silicon wafers and electronic circuit boards.

One prior art laser cutting method, disclosed in Japanese Patent Laid-Open No. 4-37492, forms a fine hole by emission of a laser beam, wherein laser cutting starts from a micro-crack generated around the fine hole. However, this method suffers from the lack of control over the direction of the crack generated by the first piercing, and in turn, over the direction of the cutting direction determined by the initial crack. Thus, the accuracy of the cutting direction is reduced.

Another laser cutting method is disclosed in Japanese Patent Laid-Open No. 4-167985. According to this method, a modified layer is formed along a predetermined cutting line, and cutting is performed by scanning the cutting line with a laser beam. The method of JP-4-167985 suffers from the increased number of working steps necessary for forming the modified layer along the predetermined cutting line.

Japanese Patent Laid-Open No. 6-39572 discloses a laser cutting method wherein cutting is performed by multiple scanning of the laser beam using a rotating mirror. JP 6-39572 suffers from poor cutting accuracy in any case other than a linear cut.

Moreover, each of these prior art methods is incapable of accurately cutting a board which has a pattern (such as a metallized wiring) that is high in laser absorptivity, because the laser beam absorption tends to cause damage to the board.

SUMMARY OF THE INVENTION

The present invention has the following objects:

To improve the accuracy in the cutting direction near the cutting start point;

To perform stable cutting at high accuracy; and

To produce a chip material with a highly accurate laser cut.

To achieve these and other objects, the present invention locally cools at least the area of the workpiece that includes the start point of the cutting, emits a laser beam to the cutting start point (preferably from the side of the workpiece opposite to the cooled surface) to form an initial crack at the cutting start point, and cuts the workpiece in a specified direction from the initial crack. By this technique, the specified direction can be controlled more accurately because the direction of the initial crack can be controlled more accurately.

The area of the workpiece that includes the end point of the cut is also, preferably, locally cooled within a range from 0° C. to −10° C. Moreover, if a cross point is contemplated, an intermediate point on the cutting line is also preferably cooled in the same manner so that the direction of the crossing cut can be accurately controlled. Thus, cutting can be performed without generation of a shift in dimension and position at the cross point.

By positioning the start point of the cut at an end surface of the workpiece, and actually initiating the cut by emitting a laser beam to the end surface, the initial crack direction can be set accurately. Then, a subsequent cut on the desired major surface of the workpiece can proceed from the initial crack. The cutting end point can be similarly processed using the same end surface processing, without a pause in the cutting step.

Moreover, in accordance with the teachings of the present invention, a workpiece having a material of high laser absorptivity can be used to advantage by employing a laser beam having a wavelength for which the workpiece is highly absorptive. For example, a wavelength may be chosen for which the material absorbs 90% or more of the light emission. A specific example is a $CO_2$ laser emitted to a mullite plate.

The invention can also be practiced by cutting the workpiece on both front and back surfaces, preferably with a laser that is highly absorbed by the workpiece, and which is transmitted to the workpiece through a filter that lowers the transmissivity of the laser beam. The filter may be formed in the same pattern as that of a material of the workpiece that is high in absorptivity to the laser, or may be removably set in the path of the laser beam.

To further improve the cutting accuracy, the temperature of a plasma located near the cutting portion of the workpiece, or the temperature of the workpiece near the cutting portion, is preferably measured, and the power supply of the laser controlled accordingly to suppress any variation in temperature at the cutting portion of the workpiece.

The local cooling may be performed by a jig, and the cutting itself performed by driving a holding jig that supports the workpiece in X-Y directions, by modulating the point of incidence of the laser beam on the workpiece, or by a combination of these two methods.

If the invention is employed to cut a chip material, quarter portions having a fine roundness (diameter of curvature) between 0.5 and 0.1 mm are obtainable.

BRIEF DESCRIPTION OF THE DRAWINGS

FIGS. 1(*a*) and 1(*b*) are sectional views illustrating an embodiment of a cutting method according to the present invention;

FIG. 2(*a*) is a plan view illustrating an embodiment of a cutting method according to the present invention;

FIG. 2(*b*) is a side view of FIG. 2(*a*);

FIGS. 6(*a*) and 6(*b*) are plan views of a workpiece illustrating an embodiment of a cutting method according to the present invention;

DETAILED DESCRIPTION OF THE PREFERRED EMBODIMENTS

When a workpiece area is locally cooled and a laser beam emitted to the cooled area, a crack is generated due to a difference in thermal expansion coefficient between the point of incidence and the region surrounding the cooled area. From this start point, laser cutting can proceed without any special cutting start point-formation processing.

The direction of the initial crack can be controlled by emitting the laser beam to a side end surface of the board that corresponds to the cutting start point on the front surface of the workpiece to be cut. The laser should be chosen to have a wavelength suitable for high absorptivity of the material constituting the workpiece at the start point. Further, if the board is sufficiently thick, laser beams can be employed to cut both major surfaces of the workpiece.

If desired, a mask having a suitably semitransparent material can be employed to equalize the effective absorptivity of highly absorptive portions of the workpiece and non-highly absorptive portions of the workpiece.

Further, the exciting power supply of the laser beam generator can be controlled on the basis of a plasma temperature measurement in the atmosphere near the cutting portion of the workpiece, or the temperature of the workpiece itself at the cutting location.

By the above techniques, rounded corners cut into the workpiece can be generated without micro-cracks.

Figure 1A:
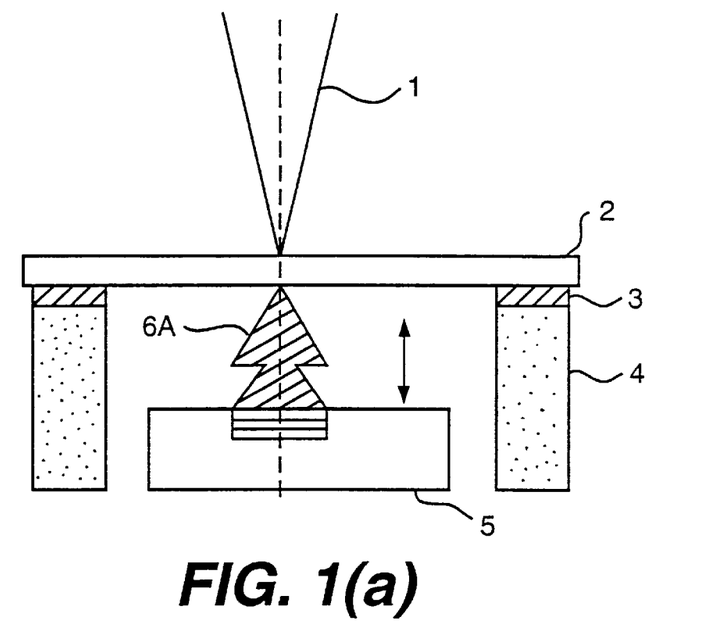

FIG. 1(a) shows an edge jig 6A mounted on a Peltier cooling plate 5. Workpiece fixing members 4 are mounted on opposite sides of the Peltier cooling plate 5. A workpiece 2, which is illustratively a ceramic board or a semiconductor wafer, is placed on the workpiece fixing members 4 with intervening thermal insulators 3.

The temperature of the Peltier cooling plate 5 is set in a range from 0° C. to –10° C. (preferably about –5° C.). The area of each cutting point on the workpiece 2 is cooled by the Peltier cooling plate 5 through the edge jig 6A where the edge jig is brought in line-contact with the workpiece 2. The workpiece is then heated by a laser beam 1 supplied from a laser generator disposed in a line with the edge jig 6A, establishing the cutting point.

At this time, a crack is generated at the cutting point due to a large difference in thermal expansion between the area of the workpiece at the cutting point and the surrounding portion of the workpiece, which is cooled by the Peltier cooling plate 5 and edge jig 6A. As a result, laser cutting for the workpiece 2 begins from the crack, without requiring any special cutting start point-forming processing. Thereafter, the workpiece 2 is cut in a specified direction from the crack by emission of the laser beam.

Figure 1B:
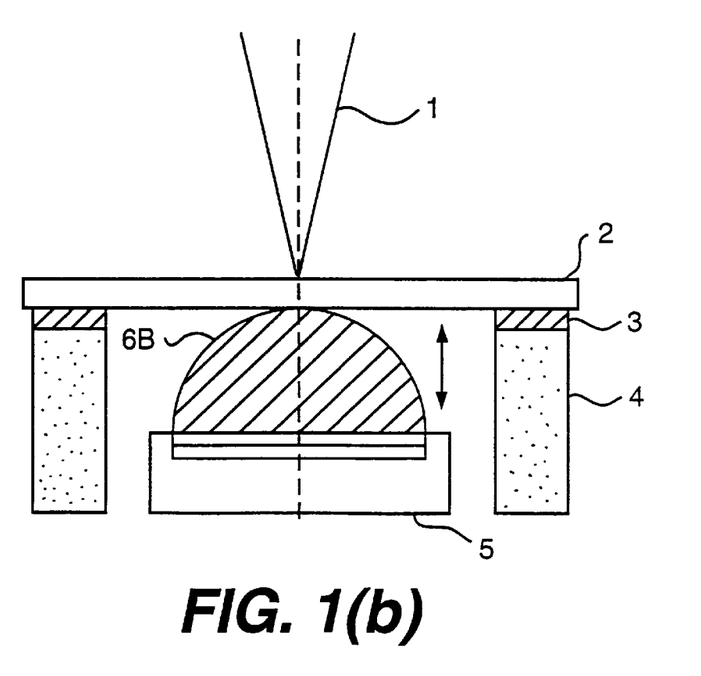

FIG. 1(b) illustrates a related embodiment, in which a semispherical jig 6B is used instead of the edge jig 6A. Each of the edge jig and the semispherical jig is preferably provided with a vertical position adjusting mechanism that adjusts the height of the respective jig to compensate for inconsistencies in the surface of the workpiece. The semispherical jig is particularly suitable for use with a workpiece that has a substantial warp.

Figure 9A:
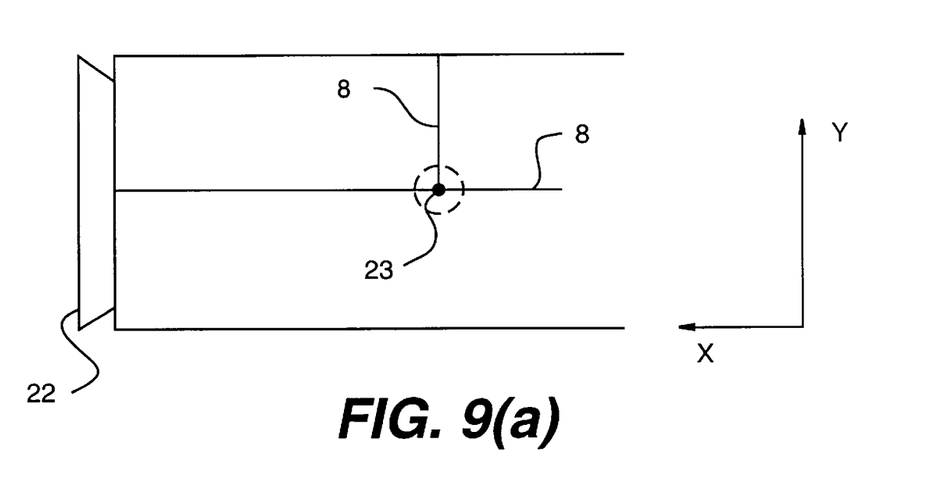
FIG. 9(a) is a plan view illustrating an embodiment of a workpiece cutting method according to the invention.
Figure 9B:
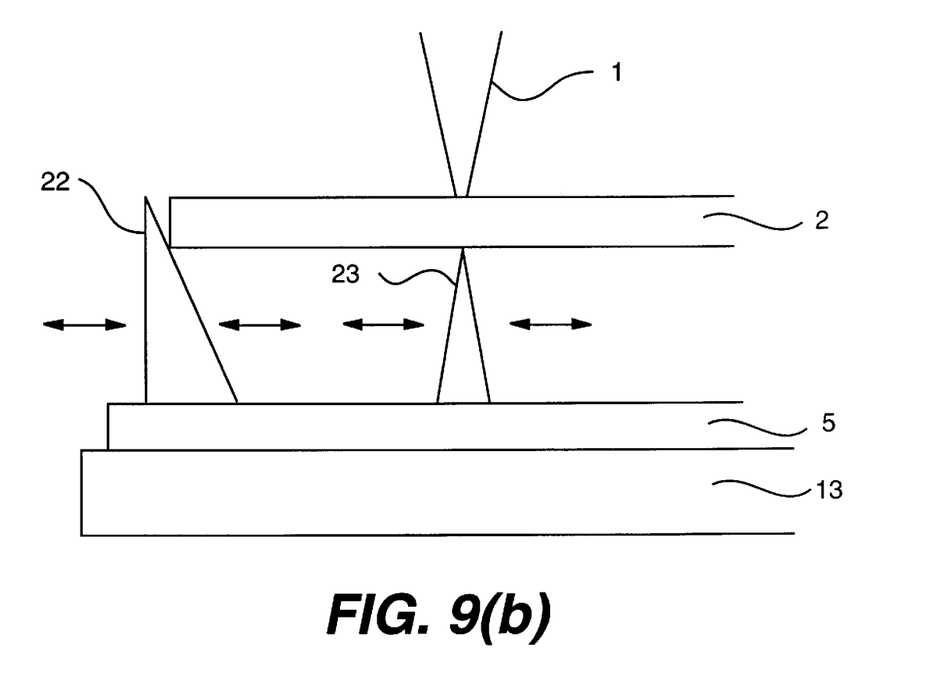
FIG. 9(b) is a sectional view of FIG. 9(a)

In some cases, an intermediate cutting point is desired to be provided on the workpiece in addition to the cutting start point and cutting end point. The cutting intermediate point may be cooled from below the surface in the same manner as described with respect to FIGS. 1(a) and 1(b), by using a movable cooling needle. Specifically, as shown in FIGS. 9(a) and 9(b), cooling jigs 22 are first positioned at both ends of the workpiece 2 to provide cooling for a cutting start point and a cutting end point. A cooling needle 23 is then moved to a cutting intermediate point, where a second cutting line is to cross the cutting line connecting the cutting start and cutting end points mentioned above. The cooling needle 23 is positioned such that a leading end thereof is brought into contact with the noted position. Its temperature is set in the range from 0° C. to –10° C. (preferably about –5° C.).

By using the cooling needle 23, the workpiece 2 can be cut by emission of the laser beam 1 without generation of a shift in dimension and position at the cross point of the cutting lines 8 (see FIG. 9(a)). This improves the accuracy of the cutting, particularly at a corner portion formed by the two cutting lines 8.

Although one cooling needle 23 is shown at the cutting intermediate point, more than one cooling needle 23 may be employed at multiple cutting points, such as the cutting start point, cutting end point, and cutting intermediate point. Preferably, the wavelength of the cutting laser beam is selected to be highly absorbed in the material constituting the workpiece 2. Desirably, 90% or more of the light emission of the laser is absorbed by the material. A $CO_2$ laser emitted to a mullite material is exemplary.

Figure 2A:
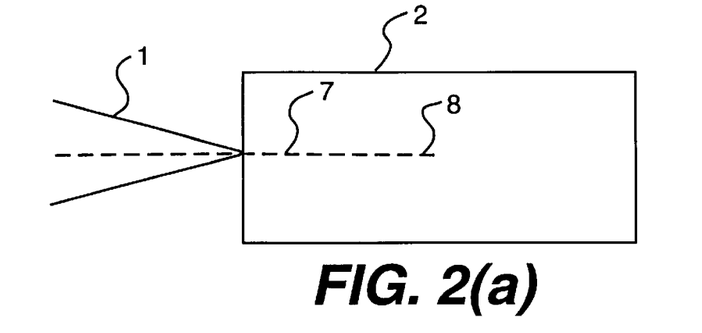
Figure 2B:
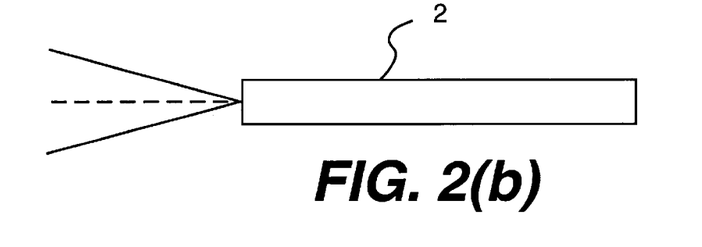

FIGS. 2(a) and 2(b) respectively show a plan view and a side view of a workpiece on which a cutting start point is generated by emitting the laser beam 1 is emitted to a side end surface of the workpiece 2. An initial crack 7 is created by the incident laser beam 1, and extends in one direction from the cutting start point on the front surface of the workpiece, which corresponds to the incident point on the side end surface. Making the laser beam incident on the end surface generates an initial crack in the direction of the laser cut to be formed. Thus, the laser cutting can start without generation of a curve at the cutting start point, by determining the cutting line along the direction of the initial crack 7. Then, the workpiece 2 is cut along the cutting line by advancing the laser beam along the upper surface of the ceramic board 2. Additionally, the same end surface processing may be performed to set the cutting end point, enabling the laser cutting to be completed free of any stoppage in the cutting itself, with excellent linearity of cut.

Figure 3:
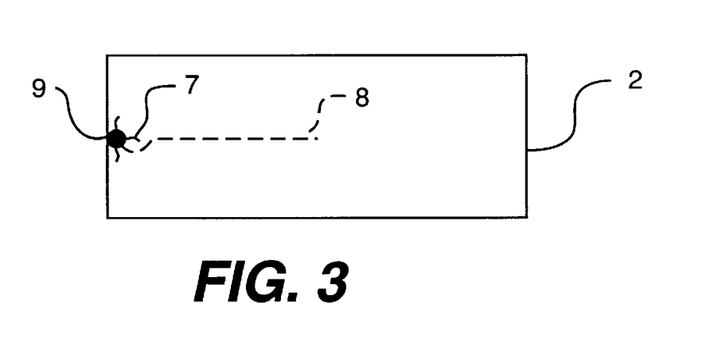
FIG. 3 is a plan view illustrating problems of the conventional laser cutting method.

FIG. 3 illustrates the results of a prior art method, for comparison. A cutting start point is formed on a workpiece 2 by piercing the workpiece with a laser. A plurality of initial cracks 7 are generated by the incident laser beam around the cutting start point (hole 9). The board is then cut from the initial cracks 7 by selecting one of the cracks and propagating the cutting line therefrom. In the illustrated example, a cutting line 8 results from the selection of one of the initial cracks 7. However, because the selected crack does not itself extend in the desired direction of the cutting line to be formed, it is necessary to curve the cutting line 8 from the initial crack near the cutting start point to the position and direction of the desired cutting line.

Figure 4:
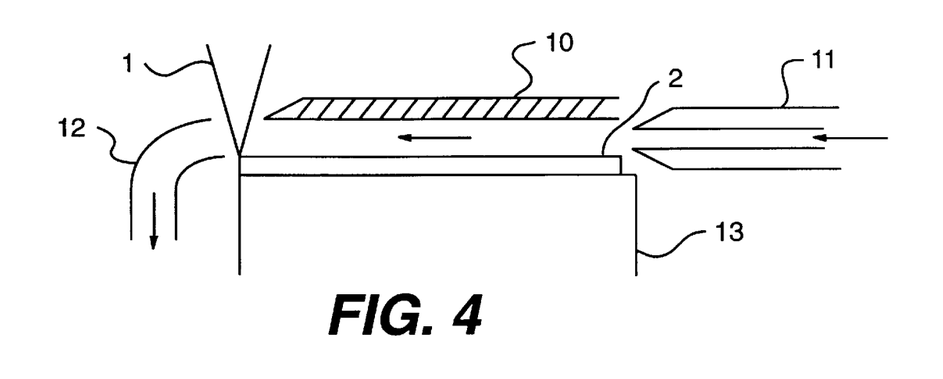
FIG. 4 illustrates an embodiment of the inventive laser cutting method.

Additionally, such a special cutting start point processing generates dust, leading to contamination of the workpiece. To prevent such contamination of the prior art, the present invention covers the entire upper surface of the workpiece 2, which is on a workpiece fixing member 13, with a cover plate 10, with the exception of the cutting start point. A gas is provided to flow between the cover plate 10 and the workpiece 2 from a nozzle 11 to the cutting start point. In addition, a duct suction port 12 is preferably provided at a side of the cutting start point to collect dust. The gas pressure may be set at 6 atm or more to instantly collect substantially all of the dust generated by the cutting.

The examples described above relate primarily to the formation of a cutting start point. The inventive method for advancing the cut from the start point will be described next.

Laser cutting, having a characteristic of propagating a crack due to a thermal stress generated by local heating, is susceptible to change in accuracy by the effects of temperature distribution, shape and dimensions of the workpiece, any pattern formed on the workpiece, and other considerations. An embodiment for carrying out the laser cutting without deleterious effects will be described with reference to FIG. 7.

Figure 7:
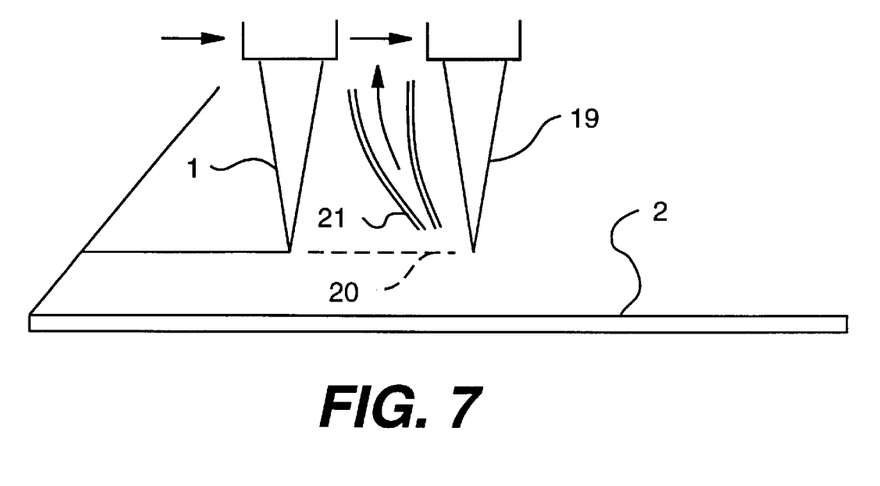
FIG. 7 also illustrates an embodiment of the inventive cutting method.

A fine groove 20 is first formed by a laser beam 19, which precedes the cutting laser beam 1. In this case, the width of groove 20 is preferably at or below about 50 $\mu$m, and the laser beam 19 is preferably formed by a pulse laser, particularly a Q switch laser. Additionally, a suction nozzle 21 is preferably provided to remove fine dust generated by the formation of the groove 20. Thereafter, a cutting laser beam 1 is emitted to the fine groove 20, to thus perform laser cutting at high accuracy.

To cut a thick brittle material, for example having a thickness of 2 mm or less, by laser emission, a thermal stress larger than that for a thin material is required. Accordingly, the output power of the laser must be increased to cut the thicker material. However, there is a limit on the power that can be employed, depending on the capacity of the laser generator, and on the melting point of the workpiece material. Therefore, the method of FIG. 8 is preferred for such a thick, brittle material.

Figure 8:
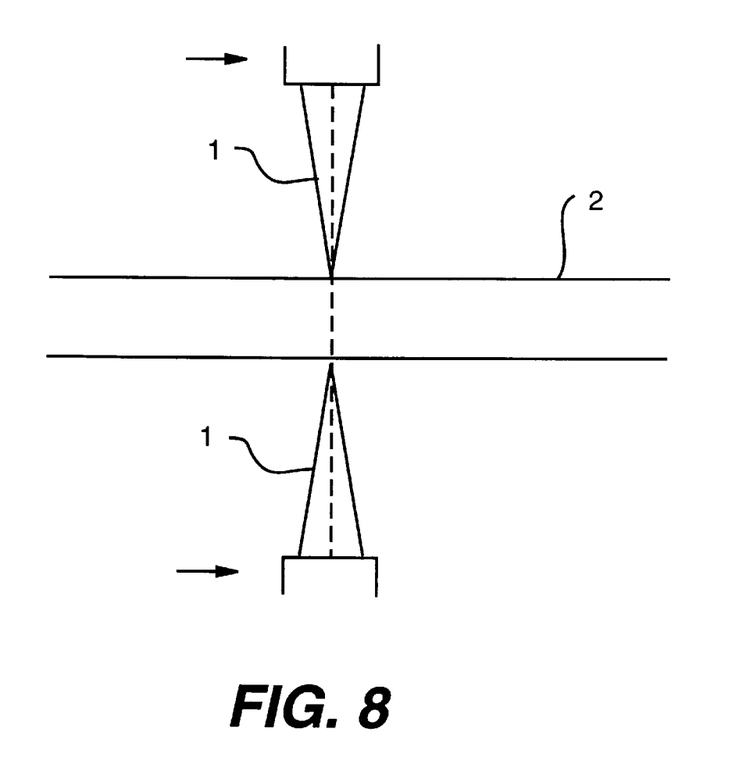
FIG. 8 is a sectional view of a workpiece illustrating an embodiment of the present cutting method.

According to the method shown in FIG. 8, two laser beams 1 are generated and incident to the opposing major surfaces of the workpiece 2. If necessary, both laser beams 1 are generated at maximum power of their respective generators. By making the laser beams 1 incident at substantially exactly opposing points on the workpiece 2, the workpiece is accurately cut.

It is noted that a safety system should be provided to ensure that the laser emission systems do not operate if no workpiece is present between the opposed laser beams 1. For example, a thick metal plate may be provided to surround the workpiece 2 so that, if the workpiece 2 proceeds out of the range of the laser beams 1, there is still a material to which the beams are incident. Alternatively, a detecting means may be provided for readily detecting and interrupting the laser emissions in the absence of an intervening workpiece.

An electronic circuit board having a plurality of patterns, such as metallized wirings, is one example of a workpiece that may be cut according to the invention. Such patterns, however, may have a larger absorptivity to the laser wavelength than the board, which may lead to damage to the pattern. In particular, in the case of using a YAG laser, the possibility of such damage becomes larger.

Figure 5:
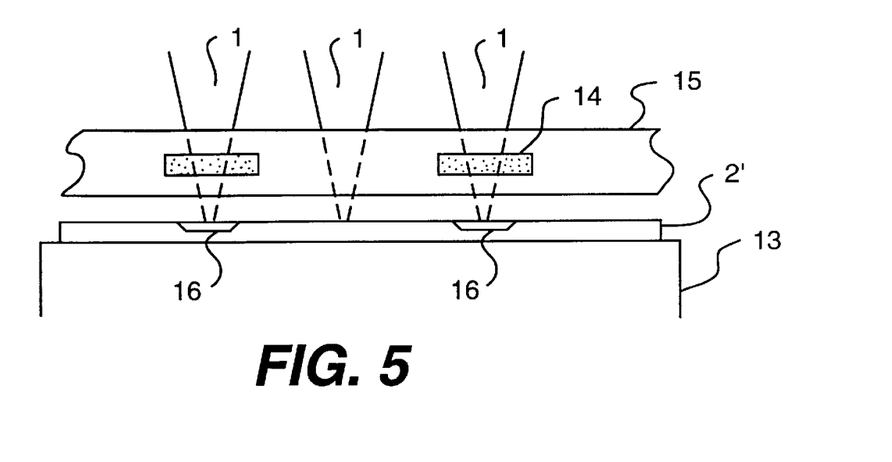
FIG. 5 illustrates another embodiment of the inventive cutting method.

To prevent such damage, the embodiment shown in FIG. 5 incorporates a glass mask 15 having semitransparent (semiabsorbing) materials 14 corresponding to the pattern position over the workpiece 2'. Then, when the laser beam 1 is emitted toward the patterns through the semitransparent materials 14, the cutting is performed without damage to the patterns. To detect the location of the patterns on the board 2, a sensor may be provided to detect the pattern. Then, the semitransparent material 14 can be located above the patterns as needed. The semitransparent material 14 may include a thin ceramic board for cutting, for example, 30% of the laser beam intensity, which suitably reduces the absorptivity of the pattern 16 to be nearly equal to that of the rest of the board 2'.

Figure 6A:
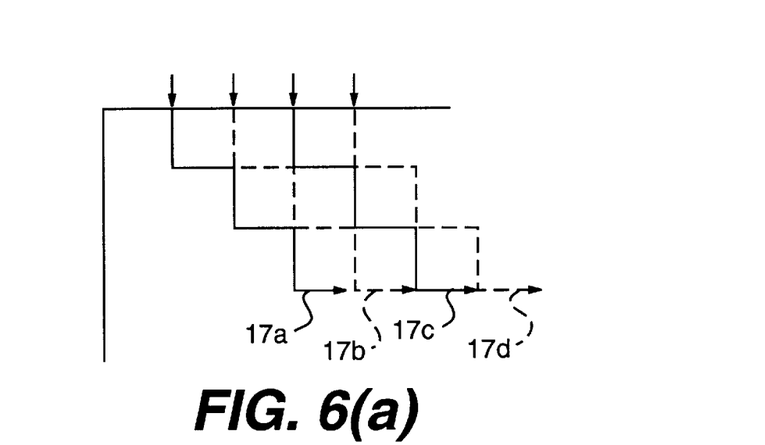
Figure 6B:
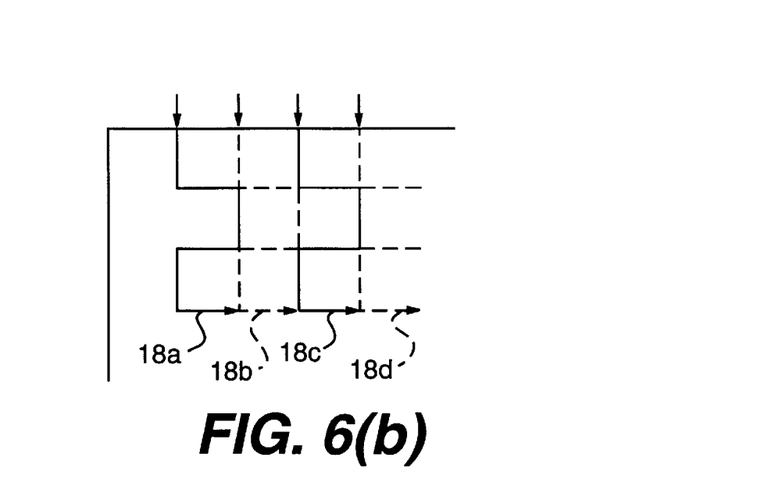

When a lattice of cutting lines is desired to be performed by laser emission, cutting tends to stop at each cross point, and the cutting lines may become deformed. To prevent such problems, the embodiment shown in FIG. 6(a) advances the cut in a stepwise fashion, in the order of cutting lines 17a, 17b, 17c and 17d, by numeric control (NC) of the board, laser head, or both. Alternatively, the board can be cut as shown in FIG. 6(b), in the order of different level cutting lines 18a, 18b, 18c, and 18d to create the same lattice. In either case, there is no actual crossing of the cutting lines, but the general principle can be applied to laser cutting of other shapes.

The dimensional accuracy of the cut tends to change due to variations in temperature of the incident portion of the material to be cut. The variation is primarily due to variation in laser output, change or uneven distribution of composition of the material, and the like. To manage such a variation in dimension and to keep desired cutting conditions, the present invention measures the temperature of a plasma at the laser emission portion and feeds back the result to control the laser output, in the embodiment shown in FIG. 10. The laser beam 1 supplied from a laser generator 29 is emitted to a workpiece 2 through a mirror 31 and a condenser lens 30. A plasma beam 24 generated at the laser emission portion on the workpiece 2 is measured by a temperature measuring camera 25, which may be an infrared camera that measures temperature based on the plasma color. The results are fed back from a feedback device 26 to a power adjustment circuit of the laser power supply 27, thereby maintaining the temperature of the plasma as desired (for example, at about 500° C. for a 1.0 mm thickness of murait). Thus, the temperature variations are suppressed, improving accuracy of the cutting.

Figure 10:
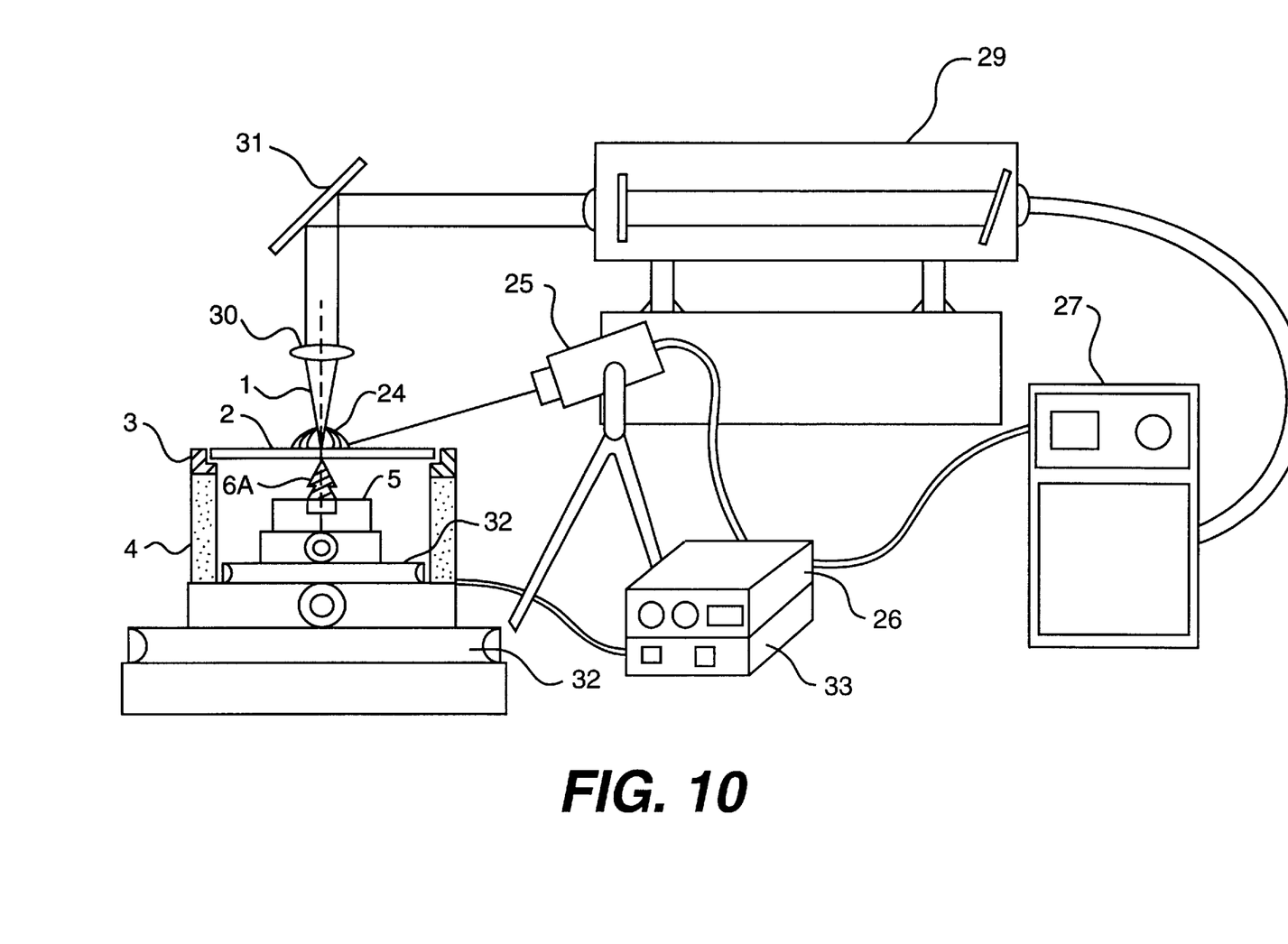
FIG. 10 is a block diagram of a cutting system according to the present invention.

Further, a biaxial table controller 33 controls an X-Y biaxial table 32. The movement of the laser emission portion may be performed not by the X-Y biaxial table 32, but by a laser optical system, or it may be performed in combination thereof. In the case of using a YAG laser which is not highly absorbed, the plasma temperature may be difficult to measure, and thereby the workpiece temperature near the cutting portion may be measured. For the above example of a 1.0 mm thickness of murait, success has been had with a surface temperature of 600° C., although the thickness has little influence on the temperature.

Laser cutting at high accuracy can be realized using any of the above-described cutting techniques. A significant advantage of the techniques is that a portion of a workpiece that is desired to be formed with a rounded corner, but requiring high dimensional accuracy, has proven difficult in the prior art. Such a rounded corner portion is desired because contact between corners of workpieces that are not properly formed may result in breakage, particularly when the workpiece is made of a material suitable for forming a semiconductor chip. The formation of such a fine roundness is difficult according to the conventional methods, and cannot be performed by machining, according to the prior art, without generating micro-cracks.

Figure 11A:
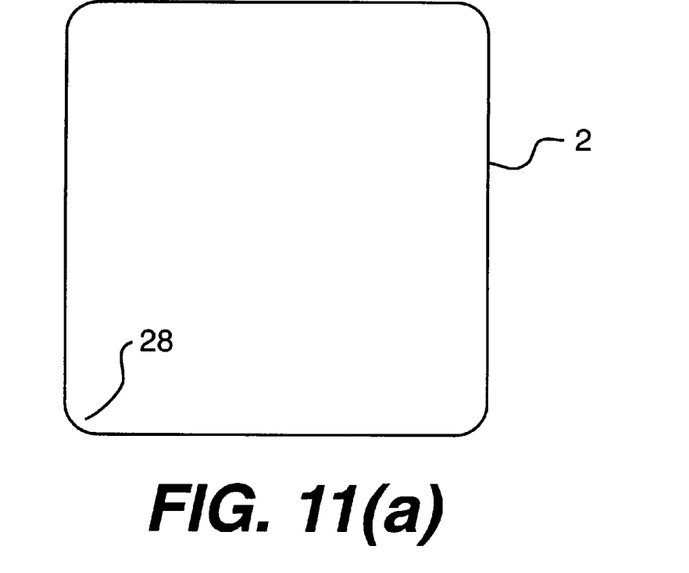
FIG. 11(a) is a plan view of an embodiment of a chip according to the present invention.
Figure 11B:
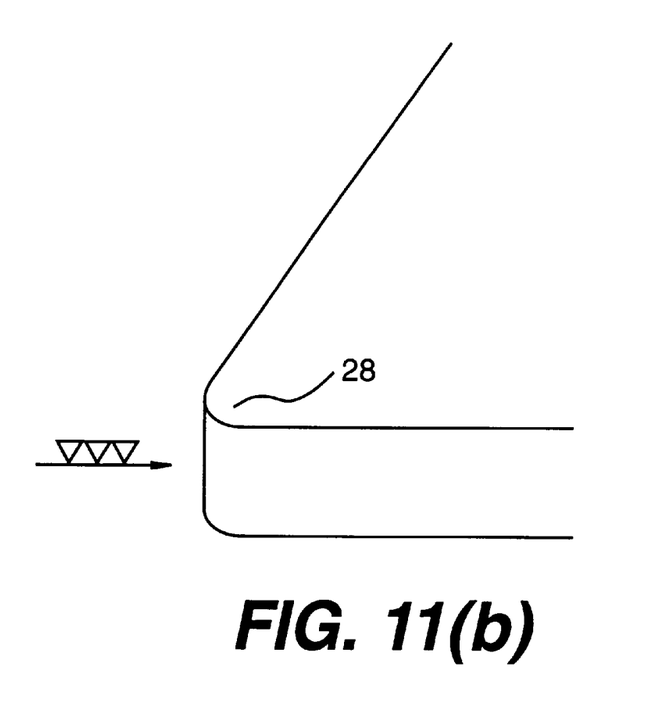
FIG. 11(b) is a partial perspective view of FIG. 11(a).

The present invention, as shown in FIGS. 11(a) and 11(b), enables a chip 2 to be formed with accurately rounded corner portions 28, without generation of such micro-cracks. The roundness, or diameter of curvature, may be formed in a range of from 0.5 to 1.0 mm.

As described above, a workpiece can be cut by laser emission with high accuracy, but without requiring a special cutting start point-forming processing, by adding a local cooling process. The direction of an initial crack generated at the cutting start point can be controlled such that the resulting cutting line is accurately formed. The invention also contemplates the tailoring of the laser wavelength to the workpiece material, adding an intensity reducer as necessary.

Thick workpieces can be cut stably and accurately by employing two laser beams to the front and back surfaces of the workpiece. Further, the temperature of the plasma near the cutting portion, or the temperature of the cutting portion itself, may be employed to provide feedback control of the laser beam excitation power supply to provide additional accuracy and stability to the cutting.

According to the invention, such workpieces as an electronic circuit board or a chip wafer can thus be cut accurately, even at corners requiring fineness in curvature, to improve upon the prior art.

The invention has been described with regard to various embodiments, any one of which may be modified by the person of ordinary skill in ways that are not specifically set forth in the disclosure. All such modifications that basically rely upon the teachings through which the invention has advanced the state of the art are properly considered within the spirit and scope of the invention.

We claim:

1. A system for cleavage cutting a workpiece by emission of a laser beam, comprising:
    a table supporting the workpiece;
    a laser generator for generating and emitting a laser beam to a first surface of the workpiece;
    determining means for determining a temperature of said workpiece near a point of incidence of the laser beam on the workpiece;
    control means for controlling an output of the laser generator based on the determined temperature, so as to keep constant the temperature of the workpiece near the point of incidence; and
    cooling means for locally cooling the point of incidence from a bottom surface of the workpiece by contacting the bottom surface with a low-temperature solid.

2. The system according to claim 1, further comprising:
    a laser power supply for the laser generator;
    wherein said control means adjusts a current of the laser power supply based on the determined temperature, so as to keep constant the temperature of the workpiece near the point of incidence.

3. The system according to claim 1, wherein said determining means measures the temperature of a plasma generated near the point of incidence.

4. A method for cleavage cutting a workpiece by emission of a laser beam, comprising the steps of:
    emitting the laser beam to a first surface of the workpiece to cleavage cut the workpiece;
    determining a temperature of a portion of the workpiece near a point of incidence of the laser beam on the first surface; and
    controlling the laser beam output on the basis of the determined temperature so as to keep constant the temperature of said portion;
    wherein said workpiece has a first region having a first absorptivity with respect to said laser beam, and a second region having a second absorptivity with respect to said laser beam, said first absorptivity being higher than said second absorptivity; and
    wherein said emitting step includes the steps of providing a semitransparent material between a source of the laser beam and said first surface at said first region, and emitting the laser beam to the first region through the semitransparent material.

5. The method according to claim 4, wherein said emitting step includes the steps of emitting the laser beam to a cutting start point on the first surface for generating an initial crack at the cutting start point, and thereafter emitting the laser beam to the first surface from the cutting start point to a direction specified by the initial crack.

6. The method according to claim 5, wherein said step of emitting the laser beam to a cutting start point includes the step of locally cooling the cutting start point from a second surface of the workpiece opposite the first surface.

7. The method according to claim 5, wherein said step of emitting the laser beam to a cutting start point includes the step of emitting the laser beam to a position, corresponding to the cutting start point on the first surface of the workpiece, from a side end surface of the workpiece for generating the initial crack at the cutting start point.

8. The method according to claim 5, wherein said step of emitting the laser beam to a cutting start point includes the steps of locally cooling the cutting start point from a second surface of the workpiece opposite the first surface, while emitting the laser beam to the cutting start point from the first surface for generating the initial crack at the cutting start point.

9. A method for cleavage cutting a workpiece by emission of a laser beam, comprising the steps of:
    emitting the laser beam to a first surface of the workpiece to cleavage cut the workpiece;
    determining a temperature of a portion of the workpiece near a point of incidence of the laser beam on the first surface; and
    controlling the laser beam output on the basis of the determined temperature, so as to keep constant the temperature of said portion;
    wherein said emitting step includes the steps of emitting the laser beam to a cutting start point on the first surface for generating an initial crack at the cutting start point, and thereafter emitting the laser beam to the first surface from the cutting start point to a direction specified by the initial crack;
    wherein said step of emitting the laser beam to a cutting start point includes the step of locally cooling the cutting start point from a second surface of the workpiece opposite the first surface; and
    wherein the step of locally cooling the cutting start point is performed by contacting the second surface of the workpiece with a low-temperature solid.

10. The method according to claim 9, wherein said emitting step includes the step of emitting the laser beam to the first surface of the workpiece and to a second surface opposite the first surface, and wherein said determining step includes the step of determining a temperature of the workpiece on at least one of the first and second surfaces.

11. The method according to claim 10, wherein respective incidence points of said laser beams on said first and second surfaces define a line that is substantially perpendicular to at least one of said first and second surfaces.

12. The method according to claim 9, wherein said emitting step includes the step of emitting a first laser beam to the first surface for forming a fine groove in a specified direction, and emitting a second laser beam to the fine groove on the first surface.

13. The method according to claim 9, wherein said determining step is performed by a temperature measuring camera.

14. The method according to claim 13, wherein the temperature measuring camera is an infrared camera.

15. The method according to claim 9, wherein the determining step is performed by measuring the temperature of a plasma generated near the point of incidence.

16. The method according to claim 15, wherein the temperature of the plasma is measured by determining a color of the plasma.

17. The method according to claim 9, wherein the determining step is performed by directly measuring the temperature of the portion of the workpiece near the point of incidence of the laser beam on the first surface.

18. The method according to claim 9, wherein the low-temperature solid is brought in line-contact with the workpiece.

19. A method for cleavage cutting a workpiece by emission of a laser beam, comprising the steps of:

emitting the laser beam to a cutting start point on a first surface of the workpiece; and locally cooling the cutting start point from a second surface of the workpiece opposite the first surface by contacting the second surface of the workpiece with a low-temperature solid while emitting the laser beam to the cutting start point from the first surface, for generating the initial crack at the cutting start point.

20. The method according to claim 19, wherein the low-temperature solid is brought in line-contact with the workpiece.

21. The method according to claim 19, wherein said emitting step includes emitting the laser beam to the first surface from a cutting start point to a cutting end point, and wherein said method further comprises the step of locally cooling the cutting end point while emitting the laser beam to the cutting end point.

* * * * *